(12) United States Patent
Liu et al.

(10) Patent No.: US 11,021,363 B2
(45) Date of Patent: *Jun. 1, 2021

(54) INTEGRATING DIVERSE SENSORS IN A SINGLE SEMICONDUCTOR DEVICE

(71) Applicant: NXP USA, Inc., Austin, TX (US)

(72) Inventors: Lianjun Liu, Chandler, AZ (US); David J. Monk, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/440,446

(22) Filed: Jun. 13, 2019

(65) Prior Publication Data

US 2019/0292042 A1  Sep. 26, 2019

Related U.S. Application Data

(62) Division of application No. 14/861,886, filed on Sep. 22, 2015, now Pat. No. 10,364,140.

(51) Int. Cl.
| | |
|---|---|
| *B81B 7/00* | (2006.01) |
| *B81C 1/00* | (2006.01) |
| *H01L 43/02* | (2006.01) |
| *H01L 43/12* | (2006.01) |
| *G01L 9/00* | (2006.01) |

(52) U.S. Cl.
CPC .......... *B81B 7/007* (2013.01); *B81C 1/00301* (2013.01); *B81C 1/00817* (2013.01); *G01L 9/0042* (2013.01); *G01L 9/0073* (2013.01); *H01L 43/02* (2013.01); *H01L 43/12* (2013.01); *B81B 2201/025* (2013.01)

(58) Field of Classification Search
CPC .... B81B 7/007; B81B 7/0074; B81C 1/00301
See application file for complete search history.

(56) References Cited

U.S. PATENT DOCUMENTS

| | | | |
|---|---|---|---|
| 7,444,738 B2 | 11/2008 | Chung et al. | |
| 8,513,042 B2 | 8/2013 | Perruchot et al. | |
| 9,040,355 B2 | 5/2015 | Bowles et al. | |
| 9,327,964 B2 * | 5/2016 | Allegata | B81B 7/0074 |
| 10,364,140 B2 * | 7/2019 | Liu | B81C 1/00817 |
| 2011/0169488 A1 | 7/2011 | Mather | |
| 2012/0001276 A1 * | 1/2012 | Huang | B81B 7/0064 |
| | | | 257/416 |
| 2012/0032283 A1 | 2/2012 | Frey et al. | |
| 2013/0043547 A1 * | 2/2013 | Chu | H01L 24/94 |
| | | | 257/415 |
| 2013/0105921 A1 * | 5/2013 | Najafi | G01C 19/574 |
| | | | 257/415 |

(Continued)

*Primary Examiner* — Stephen M Bradley
(74) *Attorney, Agent, or Firm* — Mary Jo Bertani (57) ABSTRACT

In some embodiments a method of manufacturing a sensor system can comprise forming a first structure having a substrate layer and a first sensor that is positioned on a first side of the substrate layer, bonding a cap structure over the first sensor on the first side of the substrate layer, and depositing a first dielectric layer over the cap structure. After bonding the cap structure and depositing the first dielectric layer, a second sensor is fabricated on the first dielectric layer. The second sensor includes material that would be adversely affected at a temperature that is used to bond the cap structure to the first side of the substrate layer.

19 Claims, 4 Drawing Sheets

(56) References Cited

U.S. PATENT DOCUMENTS

| | | | |
|---|---|---|---|
| 2014/0015123 A1* | 1/2014 | Bowles | B81B 7/0077 257/737 |
| 2014/0026660 A1* | 1/2014 | Zhang | G01C 19/56 73/504.12 |
| 2015/0102437 A1 | 4/2015 | Liu et al. | |
| 2015/0115378 A1 | 4/2015 | Allegato et al. | |

* cited by examiner

INTEGRATING DIVERSE SENSORS IN A SINGLE SEMICONDUCTOR DEVICE

TECHNICAL FIELD

The present invention relates generally to integrated sensor devices. More specifically, the present invention relates to different types of sensor devices integrated on the same semiconductor device.

BACKGROUND

Microelectromechanical systems (MEMS) devices are semiconductor devices with embedded mechanical components. MEMS sensor devices include, for example, pressure sensors, accelerometers, gyroscopes, microphones, digital mirror displays, micro fluidic devices, and so forth. MEMS sensor devices are used in a variety of products such as automobile airbag systems, control applications in automobiles, navigation, display systems, inkjet cartridges, and so forth.

Magnetic field sensors, also known as magnetometers, are widely used in a number of applications including in, for example, compass, security, and military applications, geophysics and space research, biomagnetism and medical applications, and non-destructive testing. Magnetic field sensors are typically based on semiconductor materials (e.g., Hall sensors, semiconductor magnetoresistors, and so forth) and ferromagnetic materials (e.g., ferromagnetic magnetoresistors and flux guides). Other magnetic field sensors utilize optical, resonant, and superconducting properties. Magnetic field sensors may be designed to sense magnetic fields along one or more mutually exclusive axes, typically referred to as the X-axis, Y-axis, and Z-axis.

Existing sensors for measuring parameters such as those mentioned above suffer from various limitations well known in the art. Examples of such limitations include excessive size and weight, inadequate sensitivity and/or dynamic range, cost, reliability and other factors. Thus, there continues to be a need for improved sensors, especially sensors that can be easily integrated with semiconductor devices and integrated circuits and manufacturing methods therefore.

The miniaturization of many modern applications make it desirable to shrink the physical size of electronic devices, integrate multiple components or devices into a single chip, and/or improve circuit layout efficiency. Ideally, such sensors should be manufactured in a cost effective manner which reduces the additional layout area or space the sensors consumes. It would be desirable to have a semiconductor-based device which includes MEMS sensor devices integrated with magnetic sensors on a single substrate, particularly where the MEMS sensor devices and the magnetic sensors are fabricated using the same process technology such that the devices and sensors are compatible with semiconductor device and integrated circuit structures and fabrication methods.

BRIEF DESCRIPTION OF THE DRAWINGS

A more complete understanding of embodiments of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

As the uses for sensor devices continue to grow and diversify, increasing emphasis is being placed on the development of advanced silicon sensor devices capable of sensing different physical stimuli at enhanced sensitivities and for integrating these sensors into the same package. In addition, increasing emphasis is being placed on fabrication methodology for sensor devices that achieves multiple stimulus sensing capability without increasing manufacturing cost and complexity and without sacrificing part performance. Forming a sensor having multiple stimulus sensing capability in a miniaturized package has been sought for use in a number of applications. Indeed, these efforts are primarily driven by existing and potential high-volume applications in automotive, medical, commercial, and consumer products.

Multi-degrees of freedom devices including accelerometers, gyroscopes, and magnetic sensors are required for non-GPS positioning and navigation applications. Combinations of sensors, such as an accelerometer plus a six degree of freedom (DOF) gyroscopic, accelerometer plus magnetic sensor compass, and accelerometer plus gyroscope plus magnetic sensor nine DOF devices, are being incorporated in new smartphones and tablets.

Magnetic sensors and MEMS accelerometers and gyroscopes are fabricated using very different processes. Almost all devices involving magnetic sensors and MEMS inertial sensors are integrated with system in package (SIP) methods using separate silicon chips. The integration of diverse types of sensors on the same chip as disclosed herein can help significantly reduce device and package cost, as well as product size. Also axis alignment of accelerometer and magnetic sensors is critical in navigation applications. Integrating different types of sensors on a single chip greatly improves the axis alignment between the different sensors.

In some embodiments disclosed herein, a first type of sensor that is capable of withstanding manufacturing processes at relatively high temperatures is integrated on the same chip with a second type of sensor that cannot withstand high temperature manufacturing processes. For example, the first type of sensor can be a micro-electromechanical system (MEMS) sensor device capable of sensing one or more types of physical stimuli. The other type of sensor can be a magnetic sensor, for example. A cap wafer is bonded to the MEMS sensor(s) at high temperatures that would damage components of the magnetic sensor. The MEMS sensor(s) and the magnetic sensor can be integrated on the same chip, however, by first manufacturing the MEMS sensor(s), forming through silicon vias (TSVs) on a cap wafer of the MEMS sensor(s), forming TSV contact and metal redistribution layer (RDL) on the top (outside) surface of the cap wafer, depositing an oxide isolation layer over the cap wafer, planarizing the oxide surface, and fabricating the magnetic sensor on top of the oxide layer.

The MEMS sensor device can include laterally spaced integrated sensors, each of which may sense a different physical stimulus. In an embodiment, one sensor of the MEMS sensor device is a pressure sensor that uses a diaphragm and a pressure cavity to create a variable capacitor to detect strain (or deflection) due to applied pressure over an area. Other sensors of the MEMS sensor device may be inertial sensors, such as an accelerometer, gyroscope, and so forth that are capable of creating a variable capacitance in response to sensed motion stimuli. A MEMS sensor device with multi-stimulus sensing capability can be implemented within an application calling for six or more degrees of freedom for automotive, medical, commercial, and industrial markets. The MEMS sensors are located in separate isolated cavities that exhibit different cavity pressures for optimal operation of each of the sensors.

Figure 1:
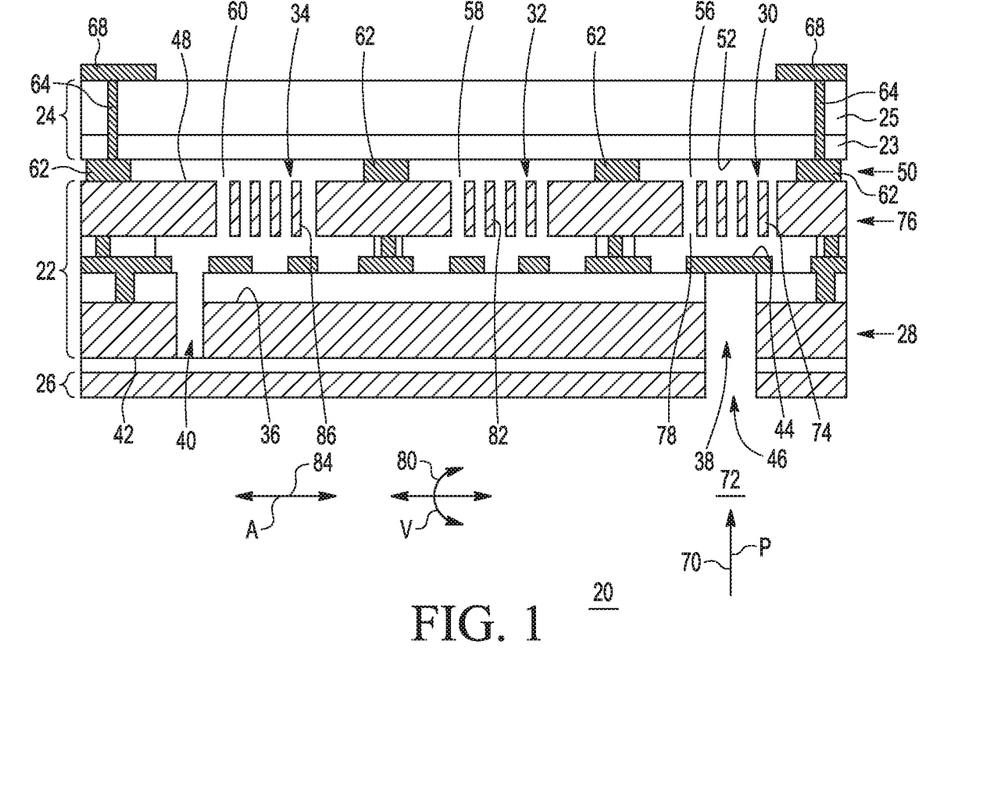
FIG. 1 shows a sectional side view of a sensor device having multiple stimulus sensing capability in accordance with an embodiment.

FIG. 1 shows a sectional side view of a microelectromechanical systems (MEMS) sensor device 20 having multiple stimulus sensing capability in accordance with an embodiment. FIG. 1 is illustrated using various shading and/or hatching to distinguish the different elements of MEMS sensor device 20, as will be discussed below. These different elements within the structural layers may be produced utilizing current and upcoming micromachining techniques of depositing, patterning, etching, and so forth.

MEMS sensor device 20 includes a device structure 22, a cap structure 24 coupled with device structure 22, and a seal structure 26 attached to device structure 22. In an embodiment, device structure 22 includes a substrate layer 28, a pressure sensor 30, an angular rate sensor 32, and an accelerometer 34. Alternative embodiments may include different sensors than those described herein. Sensors 30, 32, 34 are formed on a top side 36 of substrate layer 28, and are laterally spaced apart from one another. Cap structure 24 can include one or more dielectric layers 23 overlaid with application specific integrated circuitry (ASIC) cap wafer 25 and be coupled with device structure 22 such that each of sensors 30, 32, and 34 are interposed between substrate layer 28 and cap structure 24. ASIC cap wafer 25 can include a substrate on which integrated circuitry is formed in layers of dielectric material to perform functions such as, but not limited to, signal conditioning and data management, reset and stabilization control, bridge/output multiplexing, self-test, electrostatic discharge (ESD) protection, and so forth.

Device structure 22 further includes ports 38, 40 formed in a bottom side 42 of substrate layer 28. More particularly, port 38 extends through substrate layer 28 from bottom side 42 and is aligned with a sense element 44 of pressure sensor 30 such that sense element 44 spans fully across port 38. Port 40 extends through substrate layer 28 underlying accelerometer 34. Seal structure 26 includes an external port 46 extending through seal structure 26. In accordance with an embodiment, seal structure 26 is attached to bottom side 42 of substrate layer 28 such that port 40 is hermetically sealed by seal structure 26 and external port 46 is aligned with port 38.

Cap structure 24 can be formed before being bonded to bonding layer 50. Integrated circuitry can be formed in layers of dielectric material using known semiconductor processing technology on wafer 25 that includes a semiconductor substrate. Once the circuitry is formed, dielectric layer 23 can be deposited at relatively high temperatures to provide a high quality insulating material. Cap structure can then be bonded to bonding layer at temperatures greater than 300 degrees C. The relatively high temperature is required for inorganic eutectic or glass frit bonding to create a hermetic seal for the MEMS sensors 30, 32, 34.

In some embodiments, cap structure 24 is coupled to a top surface 48 of device structure 22 using an electrically conductive bonding layer 50 that forms a conductive interconnection between device structure 22 and cap structure 24. Conductive bonding layer 50 may be, for example, an Aluminum-Germanium (Al—Ge) bonding layer, a Gold-Tin (Au—Sn) bonding layer, a Copper-Copper (Cu—Cu) bonding layer, a Copper-Tin (Cu—Sn) bonding layer, an Aluminum-Silicon (Al—Si) bonding layer, and so forth. Conductive bonding layer 50 may be suitably thick so that a bottom side 52 of cap structure 24 is displaced away from and does not contact top surface 48 of device structure 22 thereby producing at least one hermetically sealed cavity in which sensors 30, 32, 34 are located. In some configurations, dielectric layer 23 may additionally have cavity regions (not shown) extending inwardly from bottom side 52 of cap structure 24 to enlarge (i.e., deepen) the at least one hermetically sealed cavity.

In the illustrated embodiment, MEMS sensor device 20 includes three physically isolated and hermetically sealed cavities 56, 58, 60. That is, conductive bonding layer 50 is formed to include multiple sections 62 defining boundaries between the physically isolated cavities 56, 58, 60. In the exemplary embodiment, pressure sensor 30 is located in cavity 56, angular rate sensor 32 is located cavity 58, and accelerometer 34 is located in cavity 60.

Cap structure 24 may further include at least one electrically conductive through-silicon via (TSV) 64, also known as a vertical electrical connection (three shown), extending through cap structure 24 from bottom side 52 of cap structure 24 to a top side 66 of cap structure 24. Conductive via 64 may be electrically coupled with conductive bonding layer 50. Additionally, conductive via 64 may be electrically coupled to a conductive interconnect 68 formed on top side 66 of cap structure 24. Conductive interconnect 68 represents any number of wire bonding pads or an electrically conductive traces leading to wire bonding pads formed on top side 66 of cap structure 24. Accordingly, conductive interconnects 68 can be located on top side 66 of cap structure 24 in lieu of their typical location laterally displaced from, i.e., beside, device structure 22 on a bond pad shelf. As such, in an embodiment, conductive interconnects 68 may be attached to a circuit board where MEMS sensor device 20 is packaged in a flip chip configuration. Such vertical integration effectively reduces the footprint of MEMS sensor device 20 relative to some prior art MEMS sensor devices. Two conductive vias 64 are shown for simplicity of illustration. However, it should be understood that MEMS sensor device 20 may include additional conductive vias 64, where one each of conductive vias 64 is suitably electrically connected to a particular section 62 of conductive bonding layer 50.

In an embodiment, pressure sensor 30 is configured to sense a pressure stimulus (P), represented by an arrow 70, from an environment 72 external to MEMS sensor device 20. Pressure sensor 30 includes a reference element 74 formed in a structural layer 76 of device structure 22. Reference element 74 may include a plurality of openings 78 extending through structural layer 76 of device structure 22. Sense element 44, also referred to as a diaphragm, for pressure sensor 30 is aligned with reference element 74, and is spaced apart from reference element 74 so as to form a gap between sense element 44 and reference element 74. Thus, when cap structure 24, device structure 22, and seal structure 26 are coupled in a vertically stacked arrangement, sense element 44 is interposed between reference element 74 in cavity 56 and port 38. Sense element 44 is exposed to external environment 72 via port 38 and external port 46, and is capable of movement in a direction that is generally perpendicular to a plane of device structure 22 in response to pressure stimulus 70 from external environment 72.

Pressure sensor 30 uses sense element 44 and the pressure within cavity 56 (typically less than atmospheric pressure) to create a variable capacitor to detect strain due to applied pressure, i.e., pressure stimulus 70. As such, pressure sensor 30 senses pressure stimulus 70 from environment 72 as movement of sense element 44 relative to reference element 74. A change in capacitance between reference element 74 and sense element 44 as a function of pressure stimulus 70 can be registered by sense circuitry (not shown) and converted to an output signal representative of pressure stimulus 70.

In this exemplary embodiment, angular rate sensor 32 and accelerometer 34 represent inertial sensors of MEMS sensor device 20. Angular rate sensor 32 is configured to sense an angular rate stimulus, or velocity (V), represented by a curved bi-directional arrow 80. In the exemplary configuration, angular rate sensor 32 includes a movable element 82. In general, angular rate sensor 32 is adapted to sense angular rate stimulus 80 as movement of movable element 82 relative to fixed elements (not shown). A change in a capacitance between the fixed elements and movable element 82 as a function of angular rate stimulus 80 can be registered by sense circuitry (not shown) and converted to an output signal representative of angular rate stimulus 80.

Accelerometer 34 is configured to sense a linear acceleration stimulus (A), represented by a bi-directional arrow 84. Accelerometer 34 includes a movable element 86. In general, accelerometer 34 is adapted to sense linear acceleration stimulus 84 as movement of movable element 86 relative to fixed elements (not shown). A change in a capacitance between the fixed elements and movable element 86 as a function of linear acceleration stimulus 84 can be registered by sense circuitry (not shown) and converted to an output signal representative of linear acceleration stimulus 84.

Only generalized descriptions of single axis inertial sensors, i.e., angular rate sensor 32 and accelerometer 34 are provided herein for brevity. It should be understood that in alternative embodiments, angular rate sensor 32 can be any of a plurality of single and multiple axis angular rate sensor structures configured to sense angular rate about one or more axes of rotation. Likewise, accelerometer 34 can be any of a plurality of single and multiple axis accelerometer structures configured to sense linear motion in one or more directions. In still other embodiments, sensors 32 and 34 may be configured to detect other physical stimuli, such as a magnetic field sensing, optical sensing, electrochemical sensing, and so forth.

MEMS sensor device 20 includes three cavities in which each individual sensor is housed in its own cavity. Furthermore, MEMS sensor device 20 is described as including a pressure sensor, an angular rate sensor, and an accelerometer for exemplary purposes. In alternative embodiments, those sensors that can be operated under the same cavity pressure conditions may be housed in the same cavity. For example, a multi-stimulus MEMS sensor device may include an angular rate sensor and a pressure sensor residing in the same cavity. In still other embodiments, those sensors that are operable under different cavity pressure conditions can be housed in different cavities where the cavity pressure can be suitably controlled through the MEMS sensor device fabrication process.

Figure 2:
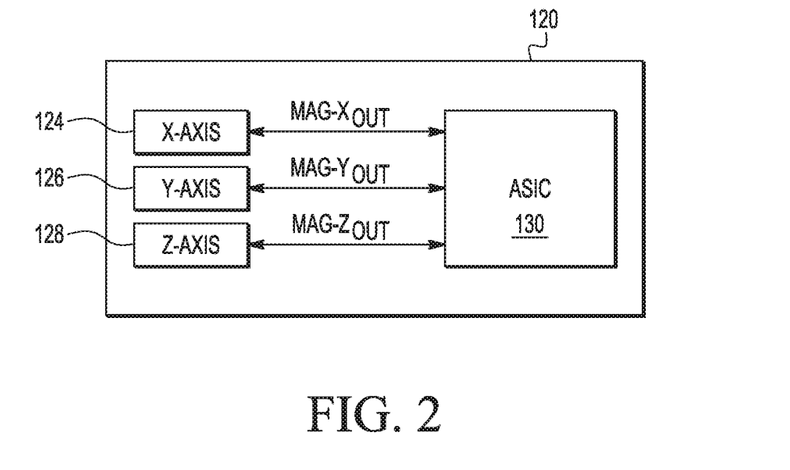
FIG. 2 shows a simplified block diagram of a magnetic sensor package that may be implemented in any device or system in which magnetic field sensing is required.

The second type of sensor can be a magnetic field sensor. FIG. 2 shows a simplified block diagram of a magnetic sensor package 120 that may be implemented in any device or system in which magnetic field sensing is required, for example, in compass, security, and military applications, in geophysics and space research applications, in biomagnetism and medical applications, and/or in non-destructive testing. In the example shown, sensor package 120 may be adapted to sense a magnetic field along three axes. Hence, sensor package 120 includes an X-axis magnetic field sensor 124, a Y-axis magnetic field sensor 126, and a Z-axis magnetic field sensor 128. Magnetic field sensors 124, 126, 128 may be coupled to, or otherwise in communication with, ASIC 25.

In an exemplary configuration, magnetic field sensors 124, 126, 128 may be magnetic tunnel junction (MTJ) sensors. An MTJ structure includes a metal-insulator-metal layer sandwich in which the metal layers are ferromagnetic and the insulator layer is very thin. Electrically, the metal-insulator-metal layer sandwich structure forms a tunnel diode in which electrons can tunnel from one ferromagnet into the other. Such a tunnel diode exhibits transport characteristics that depend, not only on the voltage bias, but also on the magnetic states of the top and bottom electrodes.

At a fixed voltage bias, the resistance of the junction depends upon the alignment of the magnetic moments of the electrodes. In general, when the moments of the two layers are parallel, the resistance of the junction is lowest. When the moments are anti-parallel, the resistance of the junction is highest. And in between, the resistance of the junction varies as the cosine of the angle between moments. In a magnetic field sensor application, the magnetic orientation of one of the ferromagnetic layers is fixed, or "pinned," in a certain direction, while the sense ferromagnetic layer is "free" to follow the orientation of the applied magnetic field which modulates the measured resistance.

Figure 3:
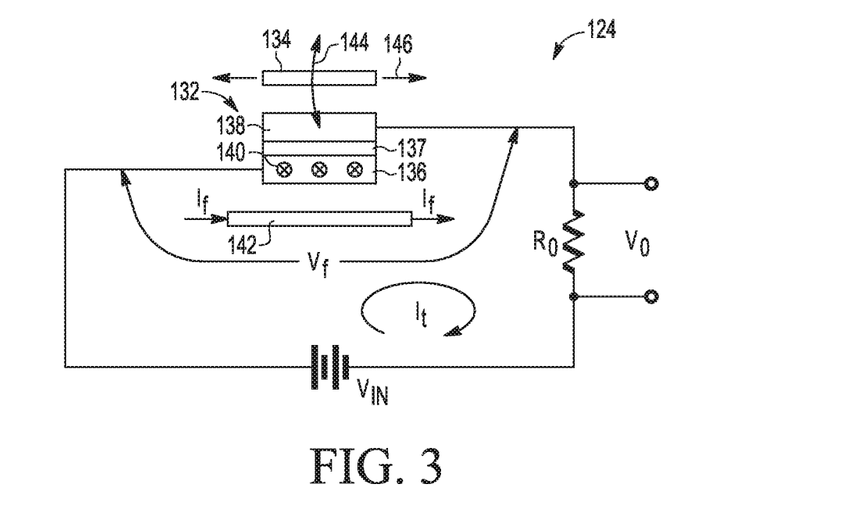
FIG. 3 shows a simplified side view of an embodiment of a magnetic field sensor that may be implemented in a sensor package.

FIG. 3 shows a simplified side view of an embodiment of X-axis magnetic field sensor 124 that may be implemented in sensor package 120 or other device. Magnetic field source (MFS) 134 is free to move as indicated by arrows 144, 146 and provides a magnetic field (not shown) that moves with respect to MTJ 132, thereby changing the intensity and/or direction of the magnetic field H at MTJ 132 depending upon the relative position of MFS 134 and MTJ 132. MTJ 132 comprises first electrode 136, insulating tunneling dielectric 137 and second electrode 138. When voltage Vt is applied across MTJ 132, current It flows by quantum mechanical tunneling through insulator 137 from electrode 136 to electrode 138 or vice versa depending upon the polarity of the applied voltage.

Electrodes 136, 138 are desirably magnetic materials, for example, and not intended to be limiting, NiFe, CoFe, and the like, or more generally, materials whose electronic spin axes can be collectively aligned. Examples of suitable electrode materials and arrangements are the materials and structures commonly used for electrodes of magnetoresistive random access memory (MRAM) devices, which are well known in the art and contain, among other things, ferromagnetic materials. Electrodes 136, 138 can have different coercive force, that is, electrode 136 can have a high coercive force so that its spin axes orientation can be pinned so as to be substantially unaffected by movement of MFS 134, and electrode 138 can have a comparatively low coercive force so that its spin axes orientation are altered by movement of MFS 134. For example, the coercive force of electrode 136 can be about two orders of magnitude larger than that of electrode 138, but bigger and smaller ratios are also useful.

The coercive force of the electrodes 136, 138 can be adjusted by varying their composition according to means known in the art. Exemplary spin axes alignments are indicated in FIG. 3 wherein vectors 140 (hereafter spin axes 140) of electrode 136 indicate that the electron spin axes in electrode 136 are aligned perpendicular to and facing into the plane of the drawings of FIG. 1, and vector 142 (hereafter spin axes 142) of electrode 138 indicates that the electron spin axes in electrode 138 are aligned parallel to the plane of the drawing and facing to the right in FIG. 1, that is, orthogonal to spin axes 140. The spin axis orientation can be pinned in one direction or another by appropriate heat treatment in the presence of a magnetic field and by other means. The spin axes in lower electrode 136, that is, in the electrode furthest from magnetic field source 134 are desirably pinned. The spin axes may be pinned in any convenient direction depending, for example, on the magnetic field direction of source 134. Spin axes 142 in upper (closest to MFS 134) electrode 138 are free, that is, not pinned and change orientation with respect to pinned spin axes 140 in electrode 136 in response to a magnetic field provided by MFS 134. Magnetic field source conductor 142 is provided proximate MTJ 132 but on the side opposite MFS 134 and oriented so as to be at right angles to MFS 134 in terms of its magnetic field. Current If is provided in MFS conductor 142 in order to restore spin axes 142 to a previous state after being flipped by proximity to a magnetic field generated by MFS 134.

Figure 4:
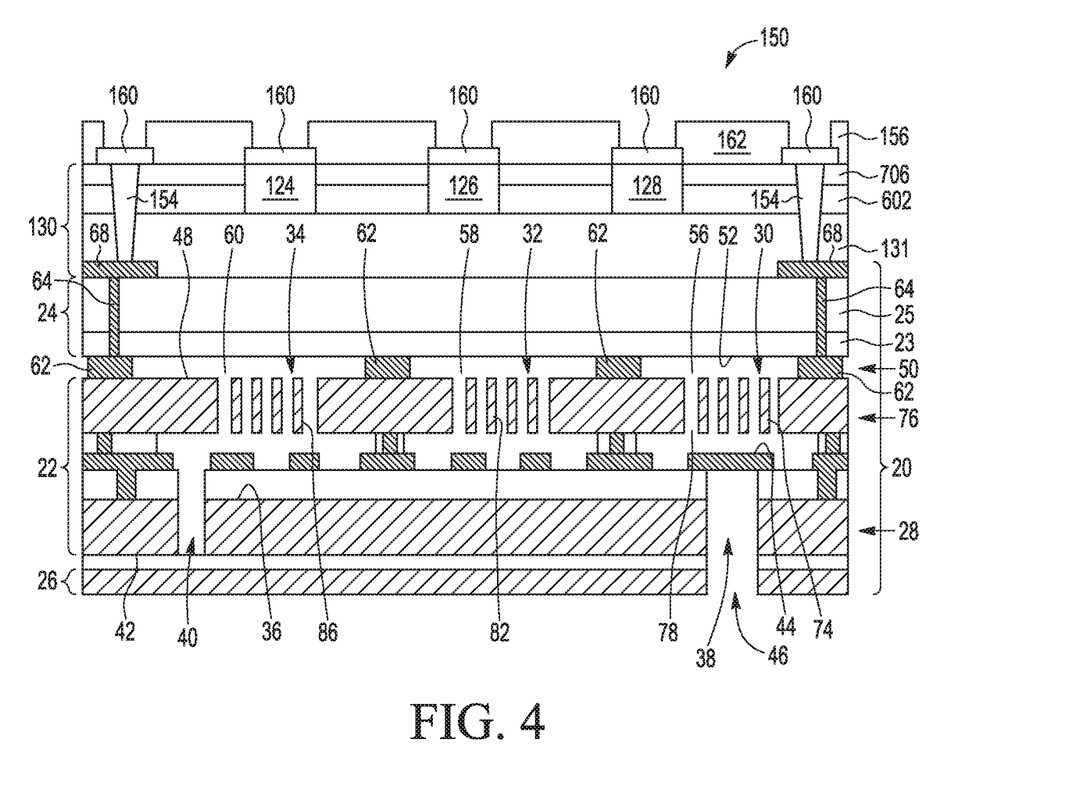
FIG. 4 illustrates a side cross-sectional view of an embodiment of a combined sensor package that includes magnetic field sensors of FIG. 3 in a dielectric layer stacked over a MEMS sensor device of FIG. 1.

FIG. 4 illustrates a side cross-sectional view of combined sensor package 150 that includes x, y, z magnetic field sensors 124, 126, 128 in dielectric or oxide isolation layers 131, 602, 706 (collectively, "oxide layer 130" or "dielectric layer 130") stacked over MEMS sensor device 20. Dielectric layer 130 is formed of one or more layers of deposited oxide that ranges in thickness from approximately 5,000 to 30,000 Angstroms, or other suitable thickness depending on the dimensions of magnetic field sensors 124-128 and the amount of insulation/separation desired between magnetic field sensors 124-128 and MEMS sensor device 20. Note that other sensors that may be included in combined sensor package 150 in addition to or instead of sensor device 20 and magnetic field sensors 124-128, and the thickness of dielectric layer 130 may be selected based on the types of sensors employed.

In addition, dielectric layer is deposited at temperatures below temperatures that would damage material used to form sensors 124-128.

Figure 5:
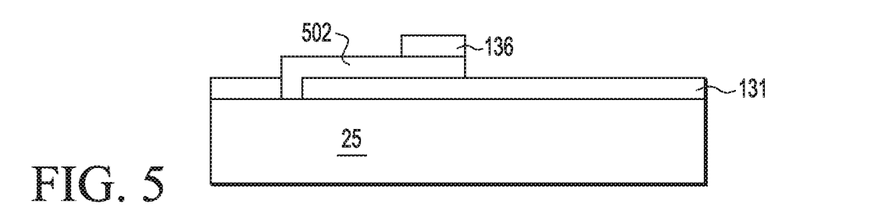
FIGS. 5-11 show successive stages of making an embodiment of a magnetic field sensor.

FIGS. 5-11 show successive stages of making an embodiment of a magnetic field sensor 124. In FIG. 5, dielectric layer 131 of, for example silicon oxide and/or silicon nitride or other insulating material is deposited and first conductor 502 of, for example aluminum, copper, tantalum, tantalum nitride, titanium, titanium nitride or the like is deposited or formed thereon and patterned to, optionally, make contact with the appropriate elements of ASIC 25. First electrode 136 of, for example iridium manganese, platinum manganese, cobalt iron, cobalt iron boron, ruthenium, and the like, and combinations of thereof, is deposited on and in electrical contact with conductor 502 and patterned to form first electrode 136 of sensor 124. The combination of materials chosen can have a relatively high coercive force. It is desirable but not essential that the various semiconductor, dielectric and conductor regions or layers provided up to now be sufficiently refractory so as to withstand annealing temperatures (e.g., between 200 and 300 degrees C.) that can be used to pin spin axes 140 (FIG. 3) in electrode 136 in a predetermined orientation. However, other means for pinning spin axes 140 may also be used.

Figure 6:
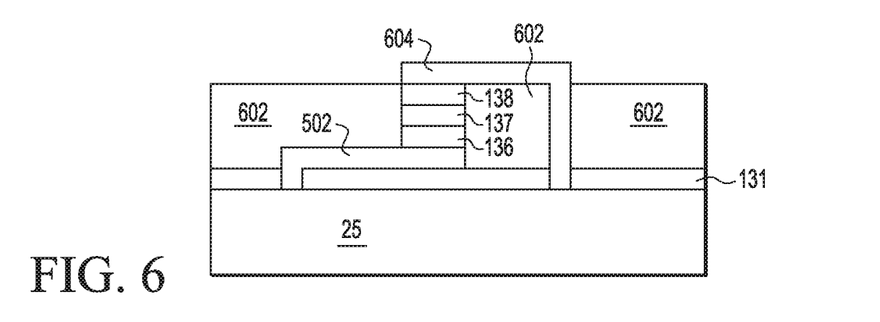

Referring to FIG. 6, tunneling dielectric 137 of, for example aluminum oxide or magnesium oxide is grown or deposited on electrode 136 and conductive electrode 138 of, for example, nickel iron, cobalt iron, cobalt iron boron, ruthenium, and/or the like and potentially capped with a conductive material such as tantalum, tantalum nitride, titanium, titanium nitride, and the like is grown or deposited on tunneling dielectric 137. The combination of materials used in electrode 138 can have a lower coercive force than the materials making up electrode 136. Electrode 136, dielectric 137 and electrode 138 form sensor 124 illustrated in FIGS. 3 and 4. Conductors 502, 604 are conveniently provided to make contact to electrodes 136, 138 respectively. While conductors 502, 604 are shown as contacting ASIC 25 this is not essential and they may be coupled to the drive electronics in any convenient manner.

First dielectric or oxide planarization layer 602 of, for example silicon dioxide, silicon nitride, phosphorous doped silicon dioxide, and the like is deposited over the existing structure so that the upper surface of electrode 138 is exposed. Alternatively, first planarization layer 602 may be deposited and then selectively removed, for example by a chemical mechanical polishing (CMP) process or by a sequence of photolithography and etch, from all or part of the upper surface of electrode 138. Conductor 604 of, for example aluminum, copper, tantalum, tantalum nitride, titanium, titanium nitride, and the like or even combinations of these types of materials is then deposited, grown or otherwise formed thereon to make electrical contact with electrode 138 and optionally with the appropriate elements of ASIC 25.

Figure 7:
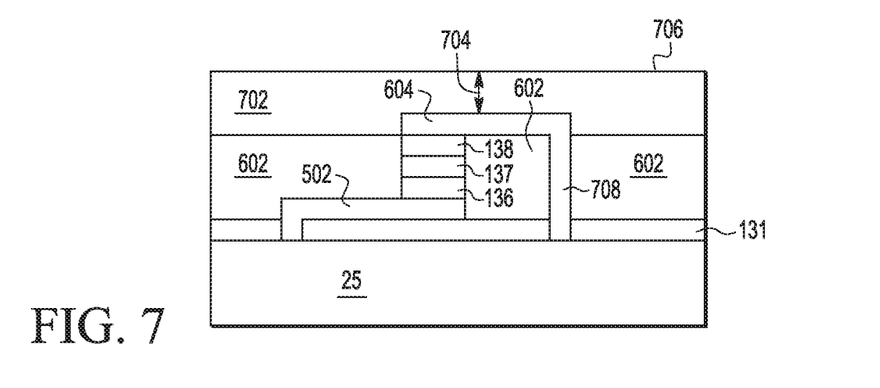
Figure 8:
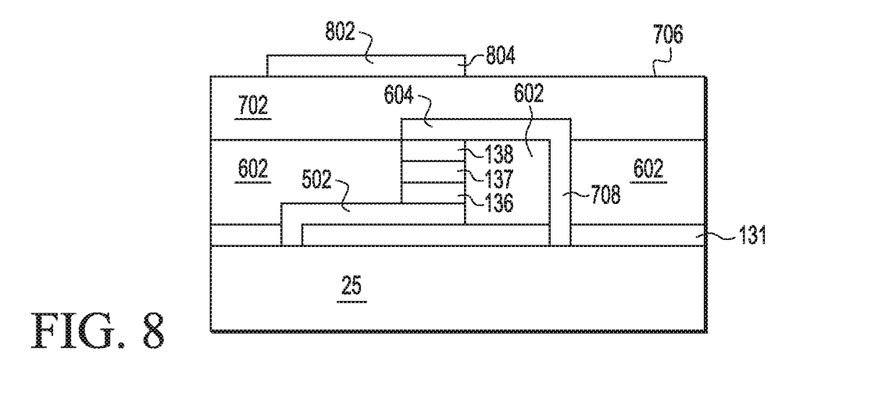

Referring to FIGS. 7 and 8, second dielectric or oxide planarization layer 702 of, for example silicon dioxide, silicon nitride, phosphorous doped silicon dioxide, and the like, with upper surface 706 is deposited or otherwise formed over first planarization layer 602 and conductor 604. Thickness 704 of second planarization layer 702 will determine in part the ambient separation of cantilevered beam 802 and sensor 124. Thickness 704 is usefully in the range 0.1 to 1.0 microns, conveniently in the range 0.1 to 0.5 microns and preferably in the range 0.2 to 0.4 microns. If a permanent magnet (not shown) is to be mounted on the lower face of cantilever beam 802 facing sensor 124, then its thickness needs to be taken into account. Sinker 708 extending from conductor 604 may be formed at the same time and as a part of conductor 604 or may be formed separately, before or after formation of conductor 604. Either arrangement is useful. However, sinker 708 is not essential and conductor 604 (and conductor 502) may be routed elsewhere rather than to ASIC 25.

The material desired for beam 802 is then grown or deposited or otherwise formed on surface 706 in the appropriate location so that magnetic field source (MFS) portion 804 will be located over sensor 124 and an anchor region located on layer 702 spaced apart therefrom by the desired beam length. A wide variety of materials, either pure or alloys or composites or layered structures may be used for the material of beam 802. Cu, Al, Au, Ti, W, poly-Si and various mixtures and alloys thereof are non-limiting examples of suitable materials but other materials can also be used. Such materials are conveniently but not essentially formed or deposited by sputtering, co-sputtering, evaporation, electroplating, electrode-less plating or chemical vapor deposition or combinations thereof may be used. Sputtering and co-sputtering, perhaps in combination with electroplating, can be used, but other materials and processes may also be used. What is important is that beam 802 has a size and stiffness appropriate for the desired application. Persons of skill in the art will understand based on the description herein, how to design and fabricate cantilevered beams of the desired properties for their applications. Beam 802 can be fabricated using Cu with a beam thickness in the range of about 0.3 to 1.0 microns and U-shaped arm widths of about 100 microns and with MFS portion 804 of about 5 microns width, for example.

Figure 9:
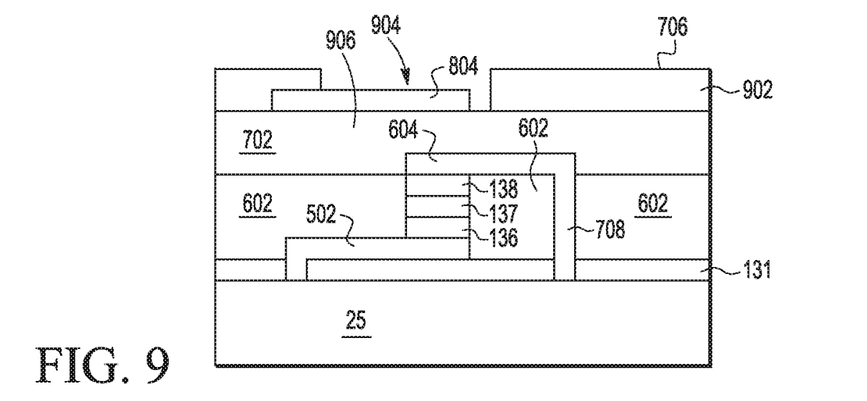
Figure 10:
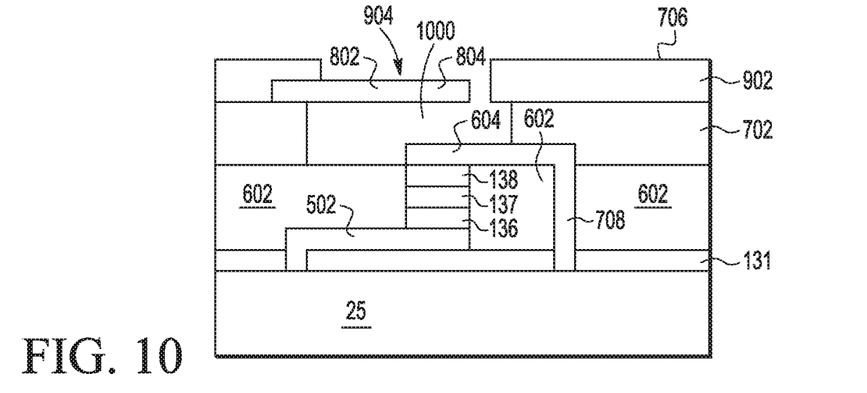
Figure 11:
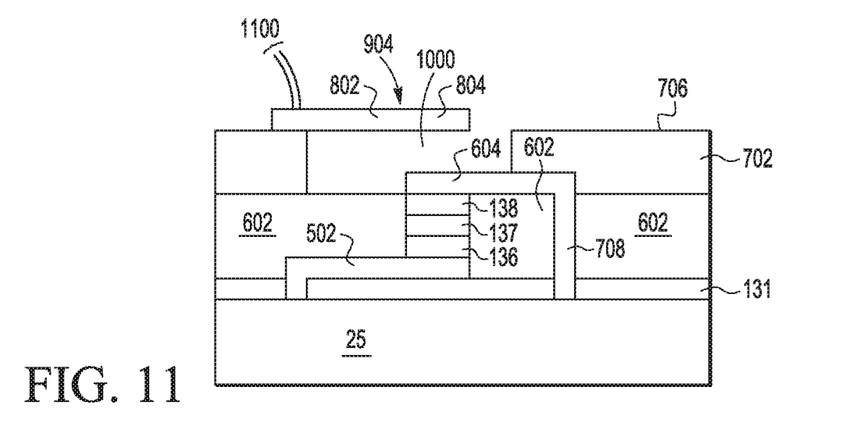

Referring to FIG. 9, additional masking layer 902 of, for example silicon dioxide or silicon nitride, is grown or deposited or otherwise formed over second planarization layer 702 and still supported beam 802. Hole or opening 904 is provided therein using means well known in the art, as for example, using a sequence of photolithography and etch. A portion of cantilevered beam 802 is left covered by masking layer 902. Hole or opening 904 otherwise extends slightly beyond the periphery of the remainder of beam 802 so portion 906 of planarization layer 702 underlying opening 904 can be removed, e.g., by for example, a wet etch process, thereby creating cavity or recess 1000 in its place, as shown in FIG. 10. It will be recognized by those skilled in the art that better control of this process can be achieved if an etch stop layer (not shown) is provided both vertically along the inside walls of the cavity 1000 as well as along the bottom of cavity 1000 prior to its formation. Beam 802 is now free except for the portion anchored to planarization layer 702. The remains of masking layer 902 are (desirably but not essentially) removed and, optionally, one or more leads 1100 for supplying current are bonded or otherwise coupled to beam 802. If the configuration of FIG. 11 is used with passive MFS (not shown), then lead(s) 1100 are not needed.

Note that magnetic field sensor 124 (and 126 and 128) can be formed using different structures, methods and materials, and the example described herein is provided for illustrative purposes only.

Referring back to FIG. 4, once magnetic field sensors 124-128 are formed, vias 154 can be etched in dielectric layer 130 and filled with conductive material that contacts conductive interconnects 68. Vias 64 and 154 can be positioned close to the edges of sensor device 150 to reduce the possibility of any fabrication processes damaging magnetic field sensors 124-128. After vias 154 are formed, conductive pads 160 can be formed over dielectric layer 130 in contact with vias 154 and sensors 124-126. Passivation layer 162 may then be patterned over dielectric layer 130, with portions of passivation layer 162 removed over conductive pads 160.

By now it should be appreciated that devices and methods have been disclosed that provide magnetic sensors and MEMS sensor fabricated in the same chip even though they are fabricated using very different processes. The integration of diverse types of sensors on the same chip as disclosed herein can help significantly reduce device and package cost, as well as product size. Also, axis alignment of accelerometer and magnetic sensors is greatly improved since the different sensors are permanently positioned and aligned with respect to one another.

In some embodiments a method of manufacturing a sensor system can comprise forming a first structure (20) having a substrate layer (28) and a first sensor (30, 32, 34) that is positioned on a first side of the substrate layer, bonding a cap structure (24) over the first sensor on the first side of the substrate layer, and depositing a first dielectric layer (131) over the cap structure. After bonding the cap structure and depositing the first dielectric layer, a second sensor (124, 126, 128) is fabricated on the first dielectric layer. The second sensor includes material that would be adversely affected at a temperature that is used to bond the cap structure to the first side of the substrate layer.

In another aspect, the method can further comprise forming a first through silicon via (TSV) (64) in the cap structure. The first TSV is coupled to conduct signals from the first sensor. An electrically conductive interconnect (68) is formed on the cap structure in contact with the first TSV.

In another aspect, the method can further comprise depositing additional dielectric layers (602, 704) on the first dielectric layer as the second sensor is formed.

In another aspect, the method can further comprise forming a second TSV (154) in the first dielectric layer and the additional dielectric layers. The second TSV is in contact with the electrically conductive interconnect on the cap structure. An electrically conductive contact is formed on a top dielectric layer of the additional dielectric layers in contact with the second TSV.

In another aspect, the method can further comprise forming an electrically conductive contact (160) on the top dielectric layer of the additional dielectric layers to conduct signals from the second sensor.

In another aspect, the bonding operation can produce a hermetically sealed cavity (56, 58, 60) in which the first sensor is located.

In another aspect, the first sensor can be one of a group consisting of: a microelectromechanical sensor (MEMS), a transducer, an inertial sensor, a resonator, a pressure sensor, an accelerometer, a gyroscope, and a microphone.

In another aspect, the second sensor is a magnetic field sensor.

In another aspect, the conductive interconnect on the cap structure is a part of a redistribution layer.

In another aspect, the cap structure includes Application Specific Integrated Circuitry (ASIC) configured to drive the first and/or second sensors.

In further embodiments, a method of making a multi-sensor device (150) can comprise fabricating a microelectromechanical system (MEMS) sensor (20), and bonding a cap structure (24) over the MEMS sensor to form a hermetically sealed cavity for the inertial sensor. The cap structure can include a dielectric layer (23) and integrated circuitry formed in a wafer (25). A through-silicon via (TSV) can be formed in the cap structure. A redistribution layer (68) can be formed on an external surface of the wafer. An interconnect of the redistribution layer can be in contact with the TSV in the cap structure. An oxide isolation layer (131) can be deposited over the redistribution layer and portions of the external surface of the wafer that are not covered by the redistribution layer. A magnetic field sensor (124-128) can then be fabricated on the oxide isolation layer.

In another aspect, the method can further comprise forming additional oxide isolation layers (602, 706) on the oxide isolation layer as the magnetic field sensor is fabricated.

In another aspect, the cap structure can be bonded over the MEMS sensor at a temperature greater than 300 degrees C.

In another aspect, the MEMS sensor can be one of a group consisting of: a transducer, an inertial sensor, a resonator, a pressure sensor, an accelerometer, a gyroscope, and a microphone.

In another aspect, the magnetic field sensor can be a magnetic tunnel junction sensor.

In still further embodiments, a multi-sensor device (150) can comprise a plurality of sensor devices (230, 32, 34) formed over a substrate, a cap structure (24) bonded over the plurality of sensor devices to form a hermetically sealed cavity around at least one of the plurality of sensor devices, a first through-silicon via (TSV) in the cap structure close to an outer edge of the cap structure, a first dielectric layer (131) over the cap structure, and a magnetic tunnel junction sensor (124-128) formed in additional dielectric layers over the first dielectric layer.

In another aspect, the multi-sensor device can further comprise a second TSV (64) in the first and additional dielectric layers, the second TSV can be coupled to the first TSV by an interconnect between the cap structure and the first dielectric layer.

In another aspect, the cap structure includes a dielectric layer (23) and integrated circuitry formed in a wafer (25).

In another aspect, the plurality of sensor devices can include one or more of a group consisting of: a transducer, an inertial sensor, a resonator, a pressure sensor, an accelerometer, a gyroscope, and a microphone.

In another aspect, the cap structure can be bonded over the plurality of sensor devices using eutectic or glass frit bonding process at a temperature over 300 degrees C.

While the principles of the inventive subject matter have been described above in connection with a specific apparatus and method, it is to be clearly understood that this description is made only by way of example and not as a limitation on the scope of the inventive subject matter. Further, the phraseology or terminology employed herein is for the purpose of description and not of limitation.

The foregoing description of specific embodiments reveals the general nature of the inventive subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A multi-sensor device comprising:
   a plurality of sensor devices formed over a substrate;
   a cap structure bonded over the plurality of sensor devices to form a hermetically sealed cavity around at least one of the plurality of sensor devices;
   a first through-silicon via (TSV) in the cap structure adjacent an outer edge of the cap structure;
   a first dielectric layer formed over the cap structure;
   additional dielectric layers fabricated over the first dielectric layer; and
   a magnetic tunnel junction sensor fabricated in the additional dielectric layers.

2. A multi-sensor device as claimed in claim 1 further comprising:
   a second TSV in the first and additional dielectric layers, the second TSV is coupled to the first TSV by an interconnect between the cap structure and the first dielectric layer.

3. A multi-sensor device as claimed in claim 1 wherein:
   the cap structure includes a dielectric layer and integrated circuitry formed in a wafer.

4. A multi-sensor device as claimed in claim 1 wherein the plurality of sensor devices includes one or more of a group consisting of: a transducer, an inertial sensor, a resonator, a pressure sensor, an accelerometer, a gyroscope, and a microphone.

5. A multi-sensor device as claimed in claim 1 wherein the cap structure is bonded over the plurality of sensor devices.

6. A sensor system comprising:
   a first structure having a substrate layer and a first sensor, the first sensor being positioned on a first side of the substrate layer;
   a cap structure bonded over the first sensor on the first side of the substrate layer;
   a first dielectric layer fabricated over the cap structure;
   a magnetic field sensor fabricated on the first dielectric layer after bonding the cap structure and depositing the first dielectric layer.

7. A sensor system as claimed in claim 6 further comprising:
   a first through silicon via (TSV) in the cap structure, wherein the first TSV is coupled to conduct signals from the first sensor;
   an electrically conductive interconnect on the cap structure, wherein the electrically conductive interconnect is in contact with the first TSV.

8. A sensor system as claimed in claim 7 further comprising additional dielectric layers deposited on the first dielectric layer, wherein the second sensor is formed in the additional dielectric layers.

9. A sensor system as claimed in claim 8 further comprising:
   a second TSV in the first dielectric layer and the additional dielectric layers, wherein the second TSV is in contact with the electrically conductive interconnect on the cap structure;
   an electrically conductive contact on a top dielectric layer of the additional dielectric layers in contact with the second TSV.

10. A sensor system as claimed in claim 9 wherein the electrically conductive contact on the top dielectric layer of the additional dielectric layers conducts signals from the second sensor.

11. A sensor system as claimed in claim 6 wherein the cap structure forms a hermetically sealed cavity in which the first sensor is located.

12. A sensor system as claimed in claim 6 wherein the first sensor is one of a group consisting of: a microelectromechanical sensor (MEMS), a transducer, an inertial sensor, a resonator, a pressure sensor, an accelerometer, a gyroscope, and a microphone.

13. A sensor system as claimed in claim 7 wherein the conductive interconnect on the cap structure is a part of a redistribution layer.

14. A sensor system as claimed in claim 6 wherein the cap structure includes Application Specific Integrated Circuitry (ASIC) configured to drive the first and/or second sensors.

15. A multi-sensor device comprising:
   a micro-electromechanical system (MEMS) sensor;
   a cap structure bonded over the MEMS sensor to form a hermetically sealed cavity for the MEMS sensor, wherein the cap structure includes a dielectric layer and integrated circuitry formed in a wafer;
   a first through-silicon via (TSV) formed in the cap structure;
   a redistribution layer formed on an external surface of the wafer, wherein an interconnect of the redistribution layer is in contact with the first TSV in the cap structure;

an oxide isolation layer deposited over the redistribution layer and portions of the external surface of the wafer that are not covered by the redistribution layer; and a magnetic field sensor fabricated on the oxide isolation layer.

16. A multi-sensor device as claimed in claim 15 further comprising:

additional oxide isolation layers on the oxide isolation layer formed as the magnetic field sensor is fabricated.

17. A sensor system as claimed in claim 15 further comprising:

the first TSV is coupled to conduct signals from the MEMS sensor;

an electrically conductive interconnect on the cap structure, wherein the electrically conductive interconnect is in contact with the first TSV.

18. A sensor system as claimed in claim 17 further comprising additional oxide layers deposited on the first oxide layer when the magnetic field sensor was formed.

19. A sensor system as claimed in claim 18 further comprising:

a second TSV in the first oxide layer and the additional oxide layers, wherein the second TSV is in contact with the electrically conductive interconnect on the cap structure;

an electrically conductive contact on a top oxide layer of the additional oxide layers in contact with the second TSV.

\* \* \* \* \*